(12) United States Patent
Pagaila et al.

(10) Patent No.: US 7,955,942 B2
(45) Date of Patent: Jun. 7, 2011

(54) SEMICONDUCTOR DEVICE AND METHOD OF FORMING A 3D INDUCTOR FROM PREFABRICATED PILLAR FRAME

(75) Inventors: Reza A. Pagaila, Singapore (SG); Yaojian Lin, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 199 days.

(21) Appl. No.: 12/467,908

(22) Filed: May 18, 2009

(65) Prior Publication Data

US 2010/0289126 A1 Nov. 18, 2010

(51) Int. Cl.
- H01F 27/06 (2006.01)
- H01F 27/30 (2006.01)
- H01L 21/12 (2006.01)
- H01F 5/00 (2006.01)
- H01L 25/10 (2006.01)

(52) U.S. Cl. .......................... 438/381; 257/531; 336/200
(58) Field of Classification Search .................. 336/200; 257/531; 438/381
See application file for complete search history.

(56) References Cited

U.S. PATENT DOCUMENTS

| | | | |
|---|---|---|---|
| 3,881,244 A * | 5/1975 | Kendall | 29/602.1 |
| 5,250,843 A | 10/1993 | Eichelberger | |
| 5,353,498 A | 10/1994 | Fillion et al. | |
| 5,841,193 A | 11/1998 | Eichelberger | |
| 7,081,803 B2 * | 7/2006 | Takaya et al. | 336/200 |
| 7,229,908 B1 * | 6/2007 | Drizlikh et al. | 438/622 |
| 7,619,901 B2 | 11/2009 | Eichelberger et al. | |
| 2003/0112114 A1 * | 6/2003 | Long et al. | 336/200 |
| 2004/0124961 A1 * | 7/2004 | Aoyagi | 336/200 |
| 2007/0085648 A1 * | 4/2007 | Lee et al. | 336/200 |
| 2007/0236319 A1 * | 10/2007 | Hsu et al. | 336/200 |
| 2008/0135977 A1 * | 6/2008 | Meyer et al. | 257/531 |
| 2009/0085704 A1 * | 4/2009 | Theuss | 336/200 |
| 2009/0188104 A1 * | 7/2009 | Ching et al. | 29/602.1 |
| 2010/0308434 A1 * | 12/2010 | Ikeda et al. | 257/531 |

* cited by examiner

Primary Examiner — N Drew Richards
Assistant Examiner — Peter Bradford
(74) Attorney, Agent, or Firm — Robert D. Atkins; Patent Law Group (57) ABSTRACT

A semiconductor device is made by mounting a semiconductor die over a carrier. A ferromagnetic inductor core is formed over the carrier. A prefabricated pillar frame is formed over the carrier, semiconductor die, and inductor core. An encapsulant is deposited over the semiconductor die and inductor core. A portion of the pillar frame is removed. A remaining portion of the pillar frame provides an interconnect pillar and inductor pillars around the inductor core. A first interconnect structure is formed over a first surface of the encapsulant. The carrier is removed. A second interconnect structure is formed over a second surface of the encapsulant. The first and second interconnect structures are electrically connected to the inductor pillars to form one or more 3D inductors. In another embodiment, a shielding layer is formed over the semiconductor die. A capacitor or resistor is formed within the first or second interconnect structures.

13 Claims, 9 Drawing Sheets

SEMICONDUCTOR DEVICE AND METHOD OF FORMING A 3D INDUCTOR FROM PREFABRICATED PILLAR FRAME

FIELD OF THE INVENTION

The present invention relates in general to semiconductor devices and, more particularly, to a semiconductor device and method of forming a 3D inductor from a prefabricated pillar frame.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

An integrated three dimensional (3D) inductor can be made by forming through mold via (TMV) in the encapsulant around a ferromagnetic core material, as described in US Publication 20080135977. The TMVs are plated to form metal inductor pillars which are electrically connected in a coiled arrangement around the ferromagnetic core. The lithography and plating processes needed to form the inductor pillars are time consuming and costly.

SUMMARY OF THE INVENTION

A need exists for 3D inductors without using costly lithography and plating processes to form the inductor pillars. Accordingly, in one embodiment, the present invention is a method of making a semiconductor device comprising the steps of providing a temporary carrier, mounting a semiconductor die or component over the temporary carrier, forming an inductor core over the temporary carrier, and mounting a prefabricated pillar frame over the temporary carrier and semiconductor die or component. The prefabricated pillar frame includes a plurality of bodies extending from a plate. The bodies are disposed around the inductor core. The method further includes the steps of depositing an encapsulant through an opening in the plate to cover the semiconductor die or component, bodies, and inductor core, removing the plate of the prefabricated pillar frame while leaving the bodies to form inductor pillars around the inductor core, forming a first interconnect structure over a first surface of the encapsulant, removing the temporary carrier, and forming a second interconnect structure over a second surface of the encapsulant opposite the first interconnect structure. The first and second interconnect structures are electrically connected to the inductor pillars to form a 3D inductor.

In another embodiment, the present invention is a method of making a semiconductor device comprising the steps of providing a carrier, mounting a semiconductor component over the carrier, forming an inductor core over the carrier, mounting a prefabricated pillar frame over the carrier, semiconductor component, and inductor core, depositing an encapsulant over the semiconductor component, prefabricated pillar frame, and inductor core, and removing a portion of the prefabricated pillar frame. A remaining portion of the prefabricated pillar frame provides inductor pillars around the inductor core. The method further includes the steps of forming a first interconnect structure over a first surface of the encapsulant, removing the carrier, and forming a second interconnect structure over a second surface of the encapsulant opposite the first interconnect structure. The first and second interconnect structures are electrically connected to the inductor pillars to form a 3D inductor.

In another embodiment, the present invention is a method of making a semiconductor device comprising the steps of providing a carrier, mounting a semiconductor component over the carrier, mounting a pillar frame over the carrier and semiconductor component, depositing an encapsulant over the semiconductor component and pillar frame, and removing a portion of the pillar frame. A remaining portion of the pillar frame provides inductor pillars. The method further includes the step of forming a first interconnect structure over a first surface of the encapsulant. The first interconnect structure is electrically connected to the inductor pillars to form a 3D inductor.

In another embodiment, the present invention is a semiconductor device comprising a semiconductor component and inductor core form in proximity to the semiconductor component. A pillar frame is mounted over the carrier and semiconductor component and inductor core. An encapsulant is deposited over the semiconductor component, pillar frame, and inductor core. A portion of the pillar frame is removed to form inductor pillars around the inductor core. A first interconnect structure is formed over a first surface of the encapsulant. A second interconnect structure is formed over a second surface of the encapsulant opposite the first interconnect structure. The first and second interconnect structures are electrically connected to the inductor pillars to form one or more 3D inductors.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along nonfunctional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
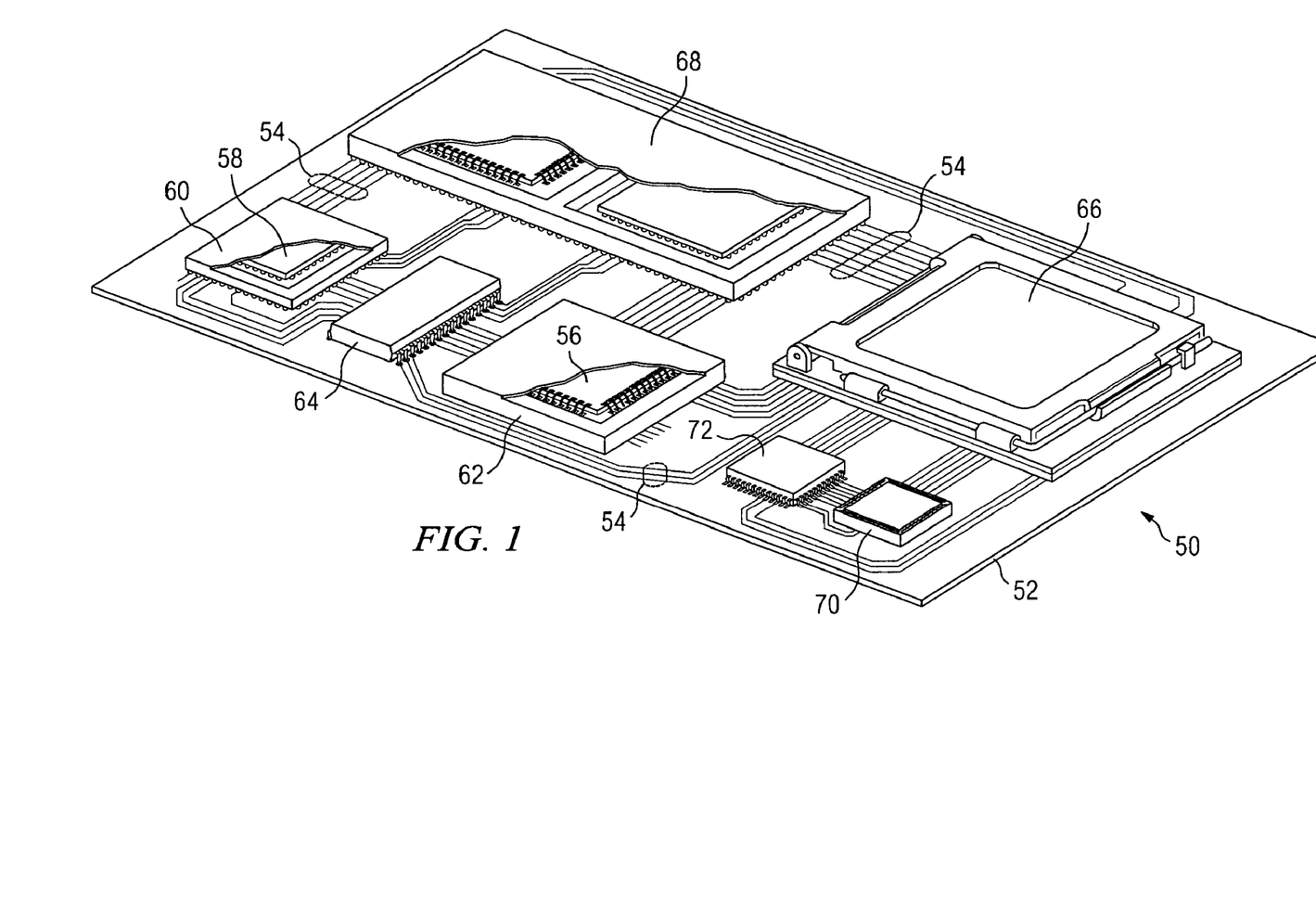
FIG. 1 illustrates a PCB with different types of packages mounted to its surface.

FIG. 1 illustrates electronic device 50 having a chip carrier substrate or PCB 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
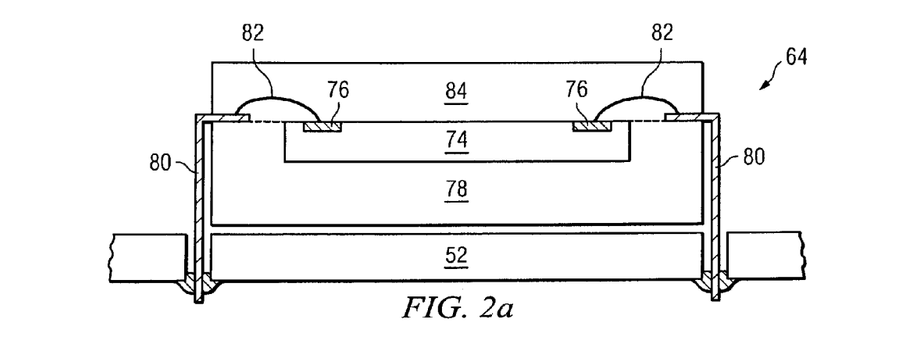
FIGS. 2a-2c illustrate further detail of the representative semiconductor packages mounted to the PCB.

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

Figure 2B:
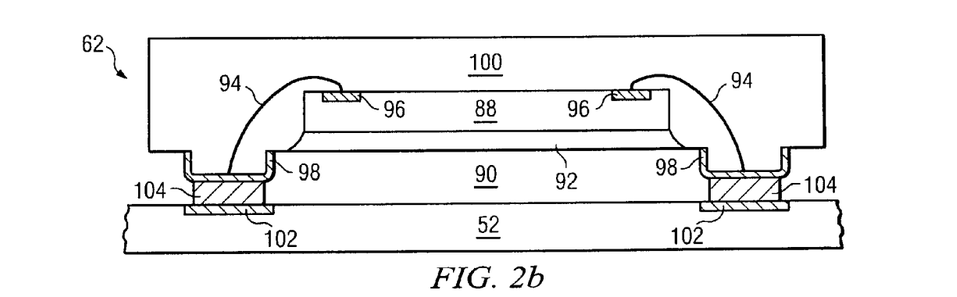

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

Figure 2C:
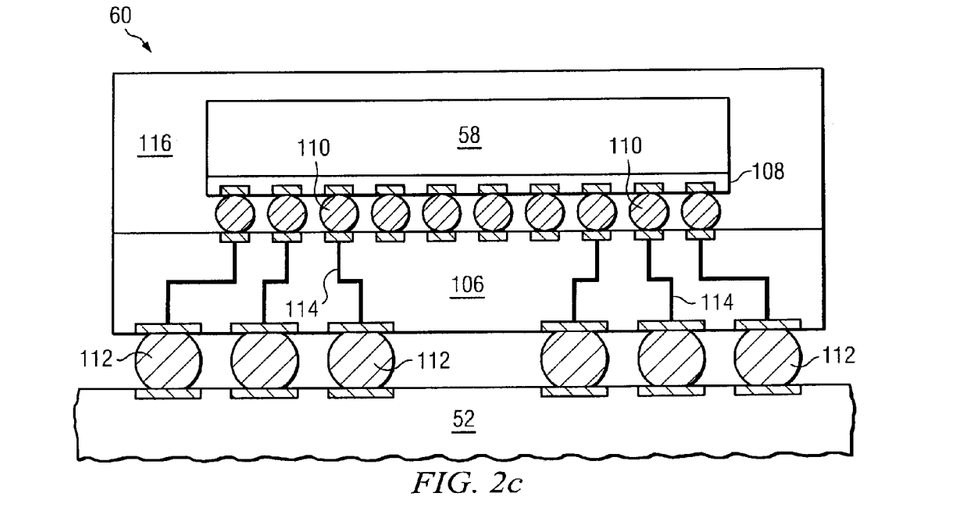

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
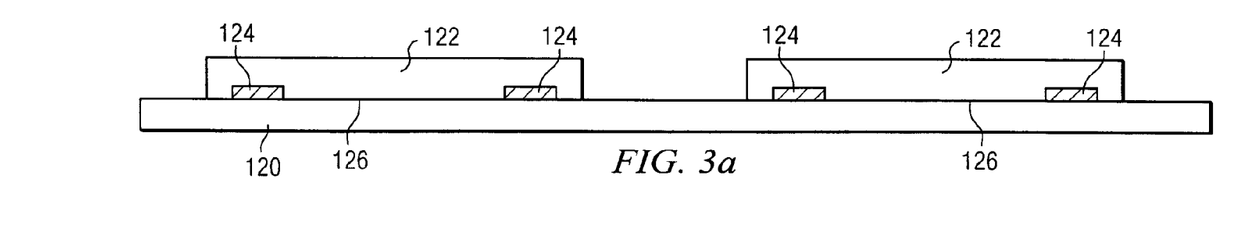
FIGS. 3a-3k illustrate a process of using a prefabricated pillar frame to form interconnect pillars and inductor pillars around an inductor core.

FIGS. 3a-3k illustrate a process of forming a semiconductor device having 3D inductors made with a prefabricated pillar frame placed over semiconductor die and inductor core. In FIG. 3a, a sacrificial or temporary reusable substrate or carrier 120 contains base material such as silicon, polymer, polymer composite, metal, ceramic, glass, glass epoxy, beryllium oxide, tape, or other suitable low-cost, rigid material for structural support.

Semiconductor die or components 122 are mounted to carrier 120 with contact pads 124 oriented downward over the carrier. Semiconductor die 122 each include an active region 126 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 126 to implement baseband analog circuits or digital circuits, such as digital signal processor (DSP), ASIC, memory, or other signal processing circuit. Semiconductor die 122 may also contain IPD, such as inductors, capacitors, and resistors, for RF signal processing. Semiconductor die 122 can be a flipchip type device or wire bond type device. In another embodiment, a discrete component can be mounted over carrier 120.

Figure 3B:
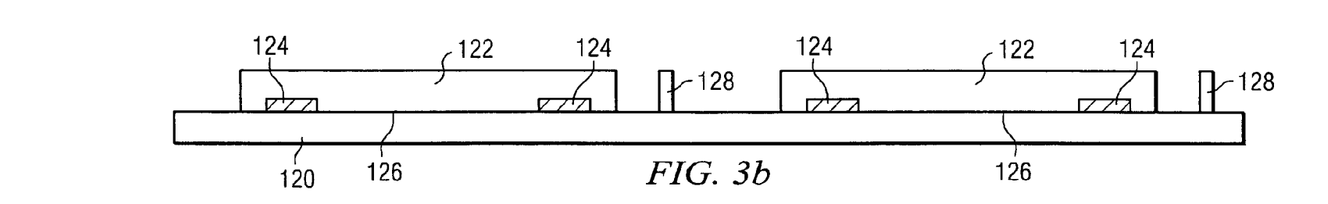

A preformed inductor core 128 is mounted over carrier 120 between semiconductor die 122. The inductor core 128 is typically surface mounted at designated locations on carrier 120. Alternatively, inductor core 128 can be deposited by PVD, CVD, or other suitable deposition process. The inductor core 128 can be suitable either crystalline or non-crystalline ferromagnetic material or ferromagnetic composite material. In other embodiment, inductor core 128 can include alloys such as FeOFe2O3, NiOFe2O3, CuOFe2O3, or MgOFe2O3.

Figure 3C:
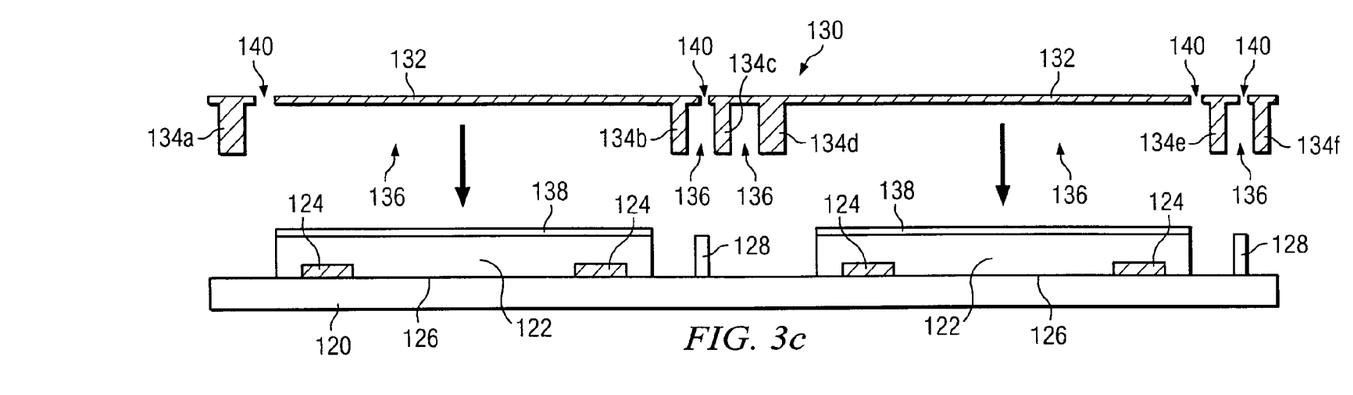
Figure 3D:
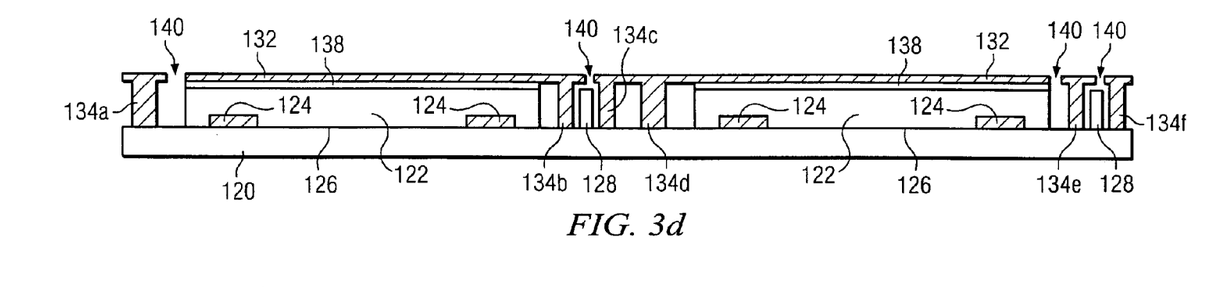

A prefabricated pillar frame 130 is mounted over semiconductor die 122 and inductor core 128, as shown in FIGS. 3c-3d. In one embodiment, prefabricated pillar frame 130 is made with Cu using leadframe technology. Pillar frame 130 includes a flat plate 132 with a plurality of bodies 134a-134f integrated with plate 132 and separated by cavities 136. Bodies 134a-134f are sufficiently thick to extend down to carrier 120 when pillar frame 130 is mounted over semiconductor die 122. An optional adhesive or thermal interface material 138 provides a secure physical contact between plate 132 and a back surface of semiconductor die 122. A plurality of openings 140 is formed through plate 132 into cavities 136. The prefabricated pillar frame 130 is simple to manufacture and cost effective in comparison to the plated TMV pillars discussed in the background.

FIG. 3d shows pillar frame 130 mounted over semiconductor die 122. Bodies 134a and 134d are vertical (z-direction) interconnect pillars. The inductor core 128 is disposed in cavity 136 between bodies 134b-134c and between bodies 134e-134f. Bodies 134b, 134c, 134e, and 134f are inductor pillars around inductor core 128.

Figure 3E:
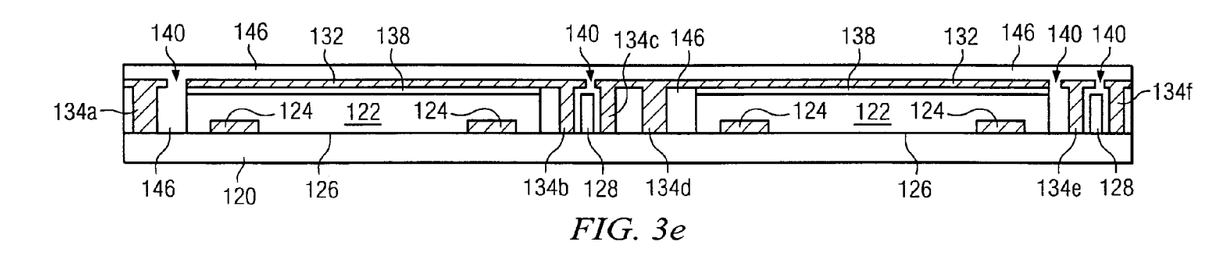

FIG. 3e shows an encapsulant or molding compound 146 deposited over semiconductor die 122 and prefabricated pillar frame 130 using a paste printing, compressive molding, transfer molding, liquid encapsulant molding, vacuum lamination, or other suitable applicator. The encapsulation process disperses encapsulant 146 through openings 140 into cavities 136 below pillar frame 130. Encapsulant 146 can be polymer composite material, such as epoxy resin with filler, epoxy acrylate with filler, or polymer with proper filler. Encapsulant 146 is non-conductive and environmentally protects the semiconductor device from external elements and contaminants. Encapsulant 146 encloses semiconductor die 122, inductor core 128, and bodies 134a-34f.

Figure 3F:
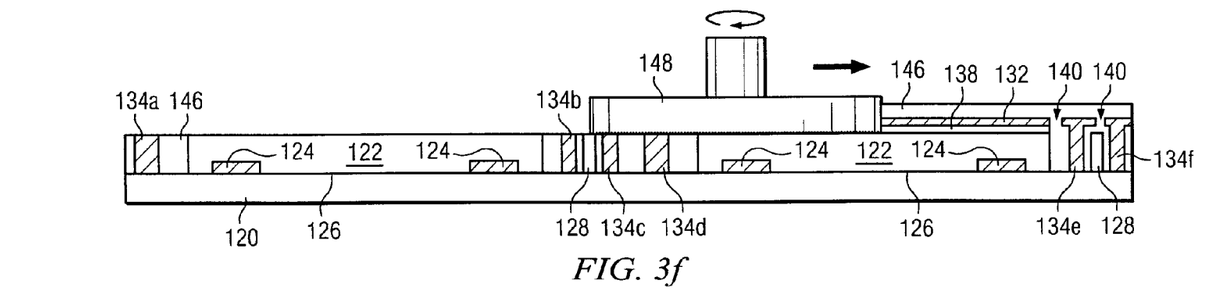
Figure 3G:
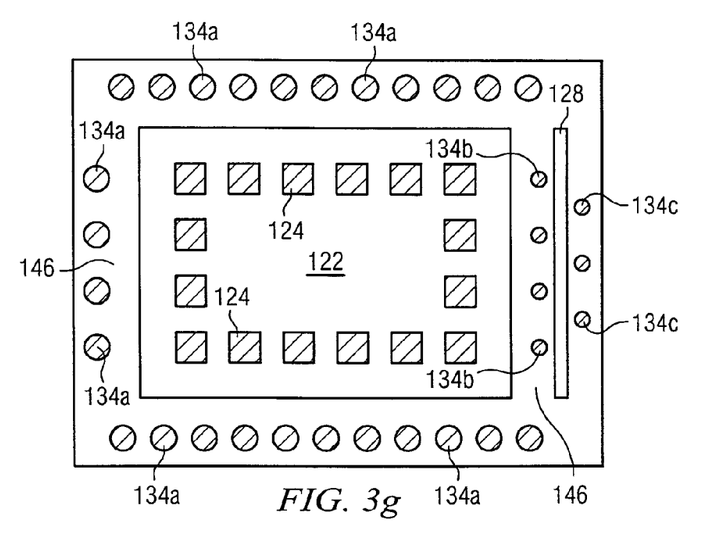

In FIG. 3f, grinder 148 removes a portion of pillar frame 130, including plate 132 and adhesive layer 138, to planarize the surface and expose encapsulant 146 in cavities 136. The remaining portion of pillar frame 130 between semiconductor die 122 becomes conductive pillars or posts 134a and 134d for vertical z-direction interconnection, and inductor pillars 134b, 134c, 134e, and 134f for RF signal processing. Alternatively, the grinding can be done after removing the sacrificial substrate or temporary carrier 120. FIG. 3g shows a top view of interconnect pillars 134a around semiconductor die 122 and inductor pillars 134b-134c around inductor core 128, all enclosed in encapsulant 146.

Figure 3H:
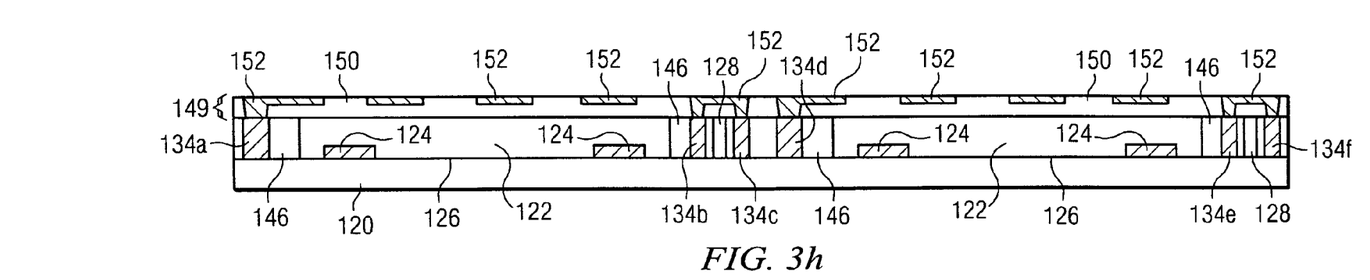

In FIG. 3h, a build-up interconnect structure 149 is formed over the back surface of semiconductor die 122, encapsulant 146, interconnect pillars 134a and 134d, and inductor pillars 134b-134c and 134e-134f. The build-up interconnect structure 149 includes at least one insulating or passivation layer. For example, passivation layer 150 is formed with PVD, CVD, printing, sintering, or thermal oxidation. The passivation layer 150 can be dielectric polymer insulation materials, such as low temperature cured photosensitive resist. Alternatively, passivation layer 150 can be one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of passivation layer 150 is removed by an etching process to expose interconnect pillars 134a and 134d, and inductor pillars 134b-134c and 134e-134f.

The build-up interconnect structure 149 further includes at least one electrically conductive layer 152 formed over or between passivation layers, for example, over passivation layer 150. Conductive interconnect pillars 134a and 134d, and inductor pillars 134b-134c and 134e-134f using patterning with PVD, CVD, sputtering, electrolytic plating, electroless plating process, or other suitable metal deposition process. Conductive layer 152 can be one or more layers of Al, Cu, Sn, Ni, Au, Ag, or other suitable electrically conductive material. Conductive layer 152 is electrically connected to interconnect pillars 134a and 134d to provide vertical, z-direction interconnect. Conductive layer 152 is also electrically connected between rows of inductor pillars 134b-134c and 134e-134f, as shown in FIG. 3j, to provide an integrated 3D inductor coiled around inductor core 128.

Figure 3I:
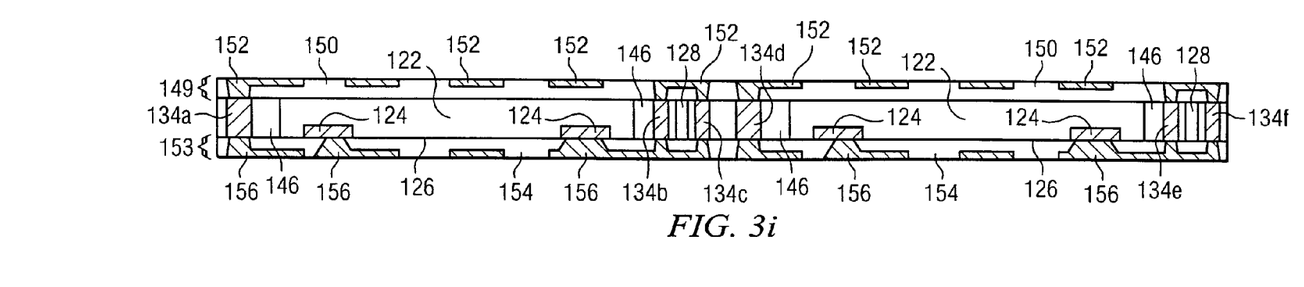
Figure 3J:
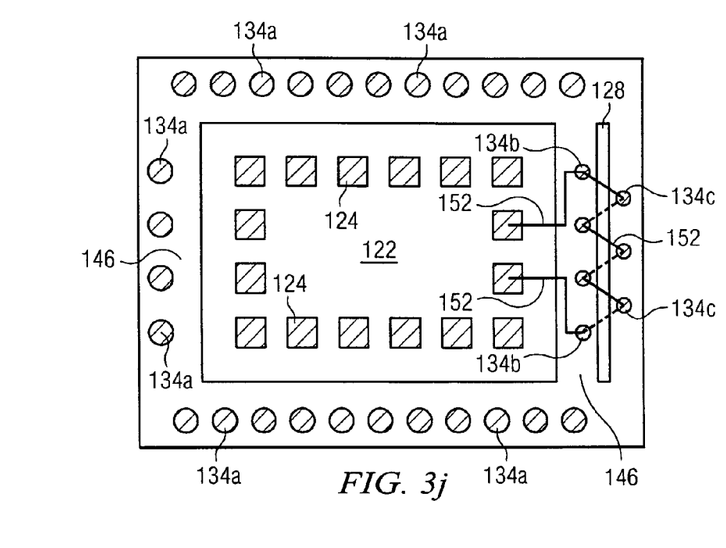

In FIG. 3i, carrier 120 is removed by chemical etching, mechanical peel-off, CMP, mechanical grinding, thermal bake, laser scanning, or wet stripping. A build-up interconnect structure 153 is formed over the front surface of semiconductor die 122, encapsulant 146, interconnect pillars 134a and 134d, and inductor pillars 134b-134c and 134e-134f. The build-up interconnect structure 153 includes at least one insulating or passivation layer 154 formed with PVD, CVD, printing, sintering, or thermal oxidation. The passivation layer 154 can be dielectric polymer insulation materials, such as low temperature cured photosensitive resist. Alternatively, passivation layer 154 can be one or more layers of SiO2, Si3N4, SiON, Ta2O5, Al2O3, or other material having similar insulating and structural properties. A portion of passivation layer 154 is removed by an etching process to expose interconnect pillars 134a and 134d, and inductor pillars 134b-134c and 134e-134f.

The build-up interconnect structure 153 further includes at least one electrically conductive layer 156 formed over or between passivation layers, for example over passivation layer 154, interconnect pillars 134a and 134d, and inductor pillars 134b-134c and 134e-134f using patterning with PVD, CVD, sputtering, electrolytic plating, electroless plating process, or other suitable metal deposition process. Conductive layer 156 can be one or more layers of Al, Cu, Sn, Ni, Au, Ag, or other suitable electrically conductive material. Conductive layer 156 is electrically connected to interconnect pillars 134a and 134d to provide vertical, z-direction interconnect. Conductive layer 156 is also electrically connected between rows of inductor pillars 134b-134c and 134e-134f, as shown in FIG. 3j, to provide an integrated 3D inductor coiled around inductor core 128. Conductive layer 156 is electrically connected to contact pads 124.

Figure 3K:
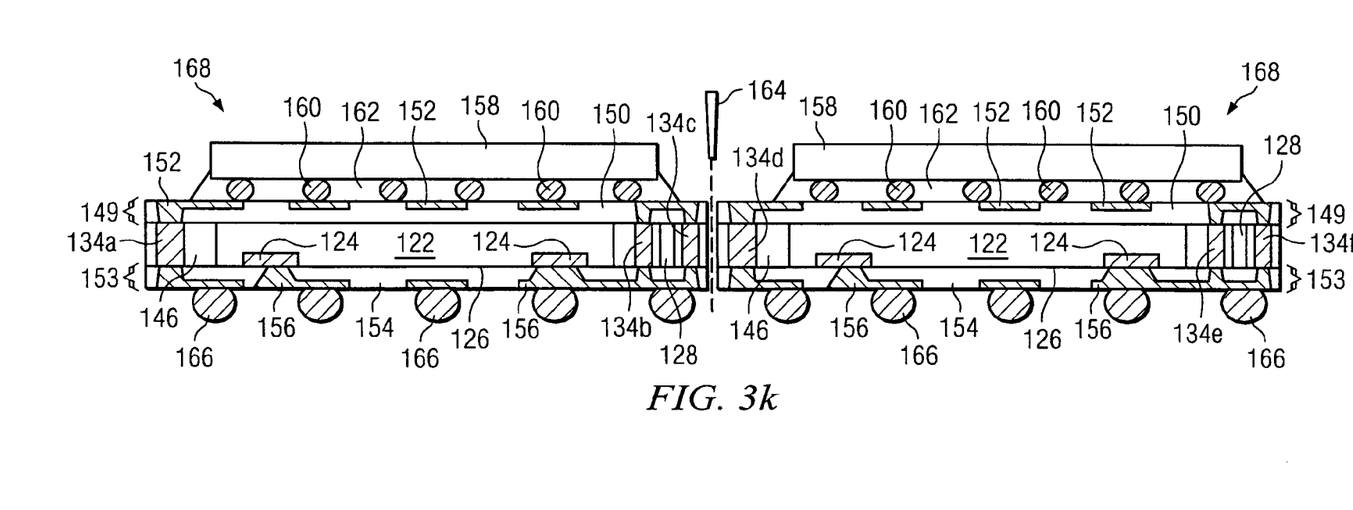

In FIG. 3k, semiconductor die or components 158 are mounted over build-up interconnect structure 149. Solder bumps 160 are electrically connected to conductive layer 152. An optional underfill material 162 is deposited between semiconductor die 158 and conductive layer 152. Semiconductor die 158 each include a substrate and active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband analog circuits or digital circuits, such as DSP, ASIC, memory, or other signal processing circuit. Semiconductor die 158 may also contain IPD, such as inductors, capacitors, and resistors, for RF signal processing. Semiconductor die 158 can be a flipchip type device or wire bond type device. In another embodiment, a discrete semiconductor component can be mounted over semiconductor die 122. The discrete semiconductor component can be a resistor, capacitor, inductor, or active semiconductor device.

An electrically conductive material is deposited over conductive layer 156 using an evaporation, electrolytic plating, electroless plating, ball drop, or screen printing process. The conductive material can be Al, Sn, Ni, Au, Ag, Pb, Bi, Cu, solder, and combinations thereof, with an optional flux material. For example, the conductive material can be eutectic Sn/Pb, high-lead solder, or lead-free solder. The conductive material is bonded to conductive layer 156 using a suitable attachment or bonding process. In one embodiment, the conductive material is reflowed by heating the material above its melting point to form spherical balls or bumps 166. In some applications, bumps 166 are reflowed a second time to improve electrical contact to conductive layer 156. The bumps can also be compression bonded to conductive layer 156. Bumps 166 represent one type of interconnect structure that can be formed over conductive layer 156. The interconnect structure can also use bond wires, conductive paste, stud bump, micro bump, or other electrical interconnect.

The structure is singulated with saw blade or laser cutting tool 164 into individual semiconductor devices 168. The IPDs in semiconductor device 168, including the 3D inductor, provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions.

Figure 4:
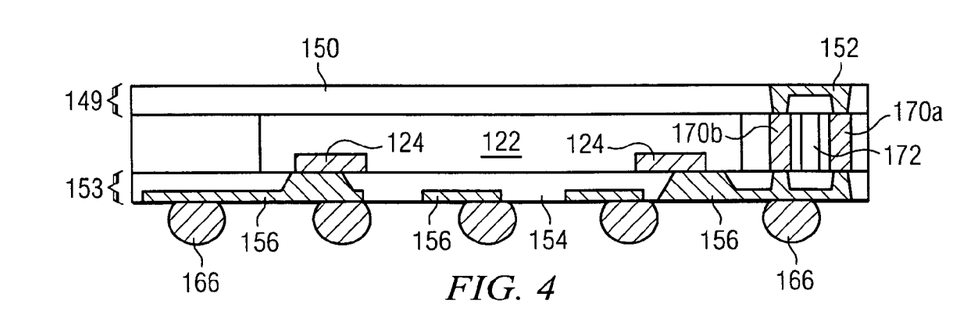
FIG. 4 illustrates the semiconductor device with 3D inductors and without interconnect pillars.

FIG. 4 shows an embodiment of the semiconductor device having the 3D inductor made with the prefabricated pillar frame, without the interconnect pillars. The inductor pillars 170a and 170b are formed around inductor core 172, using a process similar to FIGS. 3a-3k. The build-up interconnect layer 149 can be optional if passivation layer 150 is part of the encapsulation and conductive layer 152 is fabricated in lead frame technology by half etching other portions of the frame.

Figure 5:
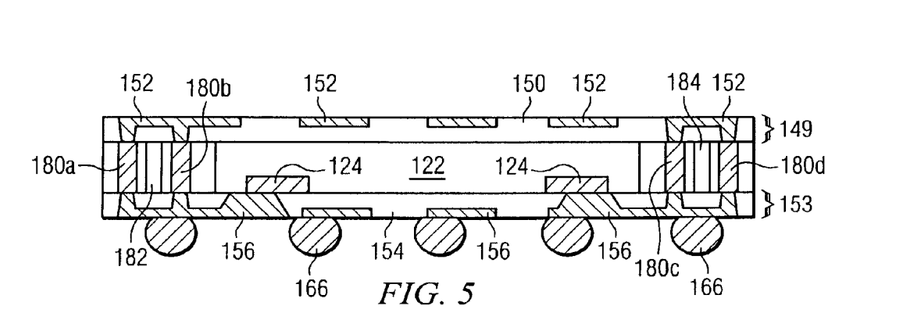
FIG. 5 illustrates the semiconductor device having multiple 3D inductors.

FIG. 5 shows an embodiment of the semiconductor device with multiple 3D inductors made with the prefabricated pillar frame. The inductor pillars 180a and 180b are formed around inductor core 182, and inductor pillars 180c and 180d are formed around inductor core 184, using a process similar to FIGS. 3a-3k. The build-up interconnect layer 149 can be optional if passivation 150 is part of the encapsulation and conductive layer 152 is fabricated in lead frame technology by half etching other portions of the frame.

Figure 6:
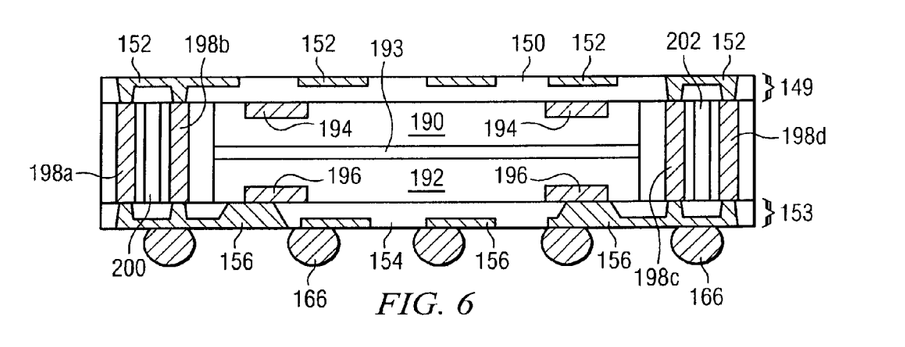
FIG. 6 illustrates stacked semiconductor die with 3D inductors and interconnect pillars.

FIG. 6 shows an embodiment of the semiconductor device having stacked semiconductor die and multiple 3D inductors made with the prefabricated pillar frame. A back surface of semiconductor die 190 is mounted to a back surface of semiconductor die 192 with an adhesive 193. Contact pads 194 of semiconductor die 190 are oriented upward and electrically connect to conductive layer 152 of build-up interconnect structure 149. Contact pads 196 of semiconductor die 192 are oriented downward and electrically connect to conductive layer 156 of build-up interconnect structure 153. The inductor pillars 198a and 198b are formed around inductor core 200, and inductor pillars 198c and 198d are formed around inductor core 202, using a process similar to FIGS. 3a-3k.

Figure 7:
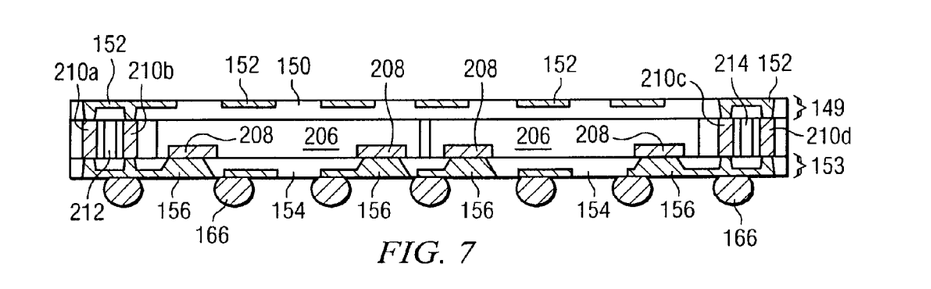
FIG. 7 illustrates side-by-side semiconductor die with 3D inductors and interconnect pillars.

FIG. 7 shows an embodiment of the semiconductor device having side-by-side semiconductor die 206 and multiple 3D inductors made with the prefabricated pillar frame. Contact pads 208 of semiconductor die 206 are oriented downward and electrically connect to conductive layer 156 of build-up interconnect structure 153. The inductor pillars 210a and 210b are formed around inductor core 212, and inductor pillars 210c and 210d are formed around inductor core 214, using a process similar to FIGS. 3a-3k.

Figure 8:
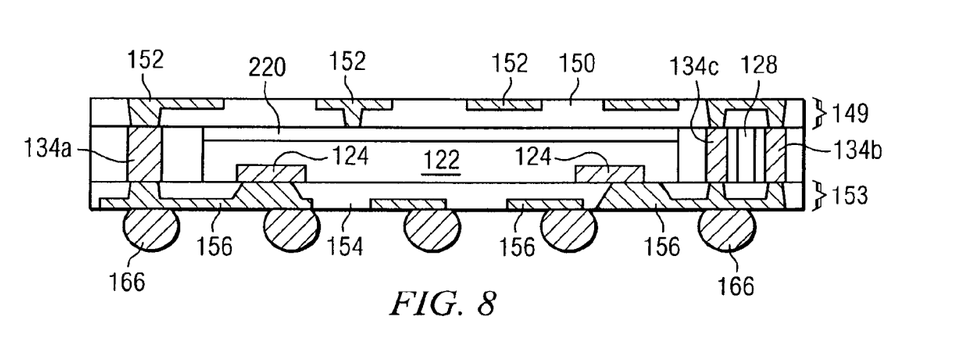
FIG. 8 illustrates the semiconductor device with 3D inductors and a shielding layer formed over the semiconductor die.

FIG. 8 shows an embodiment of the semiconductor device with the 3D inductor made with the prefabricated pillar frame and a shielding layer 220 formed over semiconductor die 122 to reduce inter-device interference of the IPD. Shielding layer 220 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Shielding layer 220 can also be a non-metal material such as carbon-black or aluminum flake to reduce the effects of EMI and RFI. Shielding layer 220 thermally contacts the backside of semiconductor die 122. Shielding layer 220 is electrically connected to a low-impedance ground point through conductive layer 152, interconnect pillars 134a, and solder bump 166. Shielding layer 220 also dissipates heat generated by semiconductor die 122.

Figure 9:
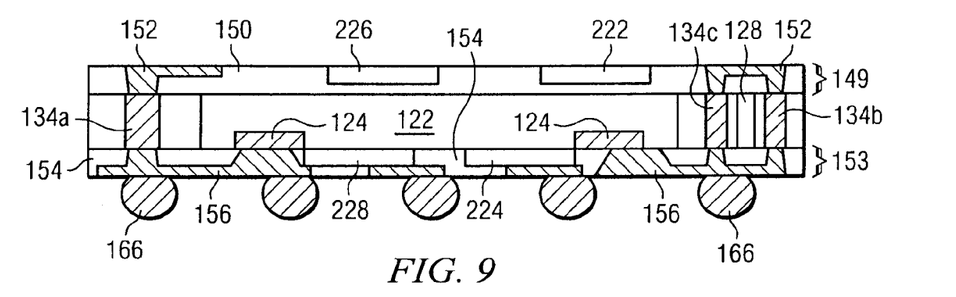
FIG. 9 illustrates the semiconductor device with 3D inductors and capacitor and resistor formed in build-up interconnect structure.

In FIG. 9, the semiconductor device with the 3D inductor made with the prefabricated pillar frame further includes a thin film capacitor 222 is formed in build-up interconnect layer 149, and thin film capacitor 224 is formed in build-up interconnect layer 153. In addition, a thin film resistor 226 is formed in build-up interconnect layer 149, and thin film resistor 228 is formed in build-up interconnect layer 153. The thin film capacitors 222-224 and thin film resistor 226-228 constitute additional IPDs that can be formed in build-up interconnect structures 149 and 153.

Figure 10:
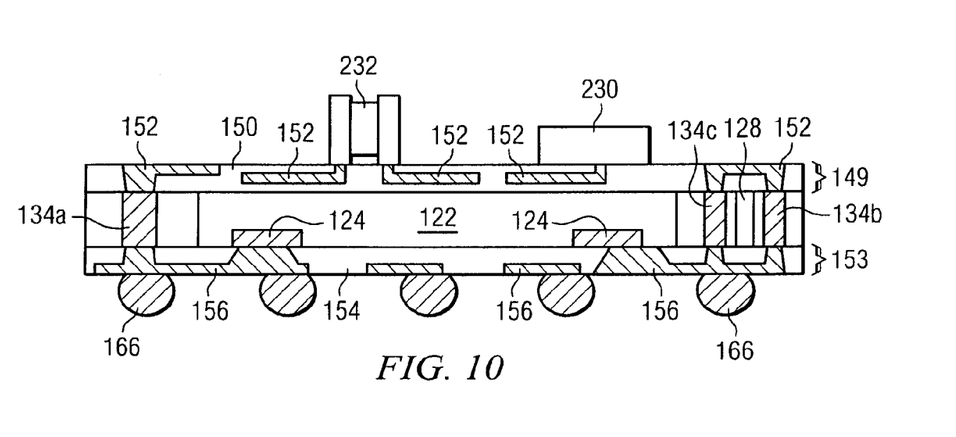
FIG. 10 illustrates the semiconductor device with 3D inductors and discrete semiconductor components formed over the build-up interconnect layer.

In FIG. 10, the semiconductor device with 3D inductor made with the prefabricated pillar frame further includes discrete semiconductor components 230 and 232 are formed over build-up interconnect layer 149 and electrically connected to conductive layer 152.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a temporary carrier;
   mounting a semiconductor die or component over the temporary carrier;
   forming an inductor core over the temporary carrier;
   mounting a prefabricated pillar frame over the temporary carrier and semiconductor die or component, the prefabricated pillar frame including a plurality of bodies extending from a plate, the bodies being disposed around the inductor core;
   depositing an encapsulant through an opening in the plate to cover the semiconductor die or component, bodies, and inductor core;
   removing the plate of the prefabricated pillar frame while leaving the bodies to form inductor pillars around the inductor core;
   forming a first interconnect structure over a first surface of the encapsulant;
   removing the temporary carrier; and
   forming a second interconnect structure over a second surface of the encapsulant opposite the first interconnect structure, the first and second interconnect structures being electrically connected to the inductor pillars to form a 3D inductor.

2. The method of claim 1, wherein the inductor core includes ferromagnetic material.

3. The method of claim 1, wherein removing the plate of the prefabricated pillar frame leaves an interconnect pillar.

4. The method of claim 3, further including stacking a plurality of the semiconductor die or components electrically connected through the interconnect pillar.

5. The method of claim 3, further including disposing a plurality of the semiconductor die or components side-by-side electrically connected through the interconnect pillar.

6. The method of claim 1, further including forming a shielding layer over the semiconductor die or component.

7. The method of claim 1, further including forming an integrated passive device within the first or second interconnect structures.

8. A method of making a semiconductor device, comprising:
   providing a carrier;
   mounting a semiconductor component over the carrier;
   forming an inductor core over the carrier;
   mounting a prefabricated pillar frame over the carrier, semiconductor component, and inductor core;
   depositing an encapsulant over the semiconductor component, prefabricated pillar frame, and inductor core;
   removing a portion of the prefabricated pillar frame, wherein a remaining portion of the prefabricated pillar frame provides inductor pillars around the inductor core;
   forming a first interconnect structure over a first surface of the encapsulant;
   removing the carrier; and
   forming a second interconnect structure over a second surface of the encapsulant opposite the first interconnect structure, the first and second interconnect structures being electrically connected to the inductor pillars to form a 3D inductor.

9. The method of claim 8, wherein the remaining portion of the prefabricated pillar frame provides an interconnect pillar.

10. The method of claim 8, wherein the first or second interconnect structure is electrically connected to a contact pad of the semiconductor component.

11. The method of claim 8, further including forming a shielding layer over the semiconductor component.

12. The method of claim 8, further including forming an integrated passive device within the first or second interconnect structures.

13. The method of claim 8, further including forming a discrete semiconductor over the first interconnect structure.

* * * * *